United States Patent [19]

Bacigalupo

[11] Patent Number: 5,250,853
[45] Date of Patent: Oct. 5, 1993

[54] CIRCUIT CONFIGURATION FOR GENERATING A REST SIGNAL

[75] Inventor: Tommaso Bacigalupo, München, Fed. Rep. of Germany

[73] Assignee: Siemens Aktiengesellschaft, München, Fed. Rep. of Germany

[21] Appl. No.: 827,758

[22] Filed: Jan. 29, 1992

[30] Foreign Application Priority Data

Jan. 29, 1991 [EP] European Pat. Off. ........ 91101146.8

[51] Int. Cl.$^5$ ........................ G11C 11/00; H03K 3/01
[52] U.S. Cl. ................. 307/272.3; 307/296.4; 307/296.5; 307/594
[58] Field of Search ............ 307/272.3, 592, 594, 307/597, 296.5, 296.4, 303

[56] References Cited

U.S. PATENT DOCUMENTS

| | | | |
|---|---|---|---|
| 3,895,239 | 7/1975 | Alaspa | 307/594 |
| 4,634,904 | 1/1987 | Wong | 307/594 |
| 4,797,584 | 1/1989 | Aguti et al. | 307/594 |
| 4,818,904 | 4/1989 | Kobayashi | 307/594 |
| 5,039,875 | 8/1991 | Chang | 307/272.3 |
| 5,115,146 | 5/1992 | McClure | 307/272.3 |

FOREIGN PATENT DOCUMENTS 0150480 8/1985 European Pat. Off. .

OTHER PUBLICATIONS

IEEE Journal of Solid-State Circuits, vol. SC-12, No. 5, Oct. 1977, New York, pp. 502-506; Stewart.

*Primary Examiner*—William L. Sikes
*Assistant Examiner*—Toan Tran
*Attorney, Agent, or Firm*—Herbert L. Lerner; Laurence A. Greenberg

[57] ABSTRACT

A circuit configuration for generating a reset signal includes a bistable switch element assuming a preferential state upon application of a supply voltage. The bistable switch element has an output carrying a reset signal in the preferential state and has an input. An on and off switchable reference voltage source has a control input connected to the output of the bistable switch element. The on and off switchable reference voltage source is switched on in the preferential state of the bistable switch element. An on and off switchable delay line has a control terminal connected to the output of the bistable switch element, an output connected to the input of the bistable switch element, and a reference input connected to the on and off switchable reference voltage source for switching on the delay line in the preferential state of the bistable switch element. The bistable switch element is switched out of the preferential state with a time delay when the supply voltage exceeds a reference value specified by the on and off switchable reference voltage source.

14 Claims, 1 Drawing Sheet

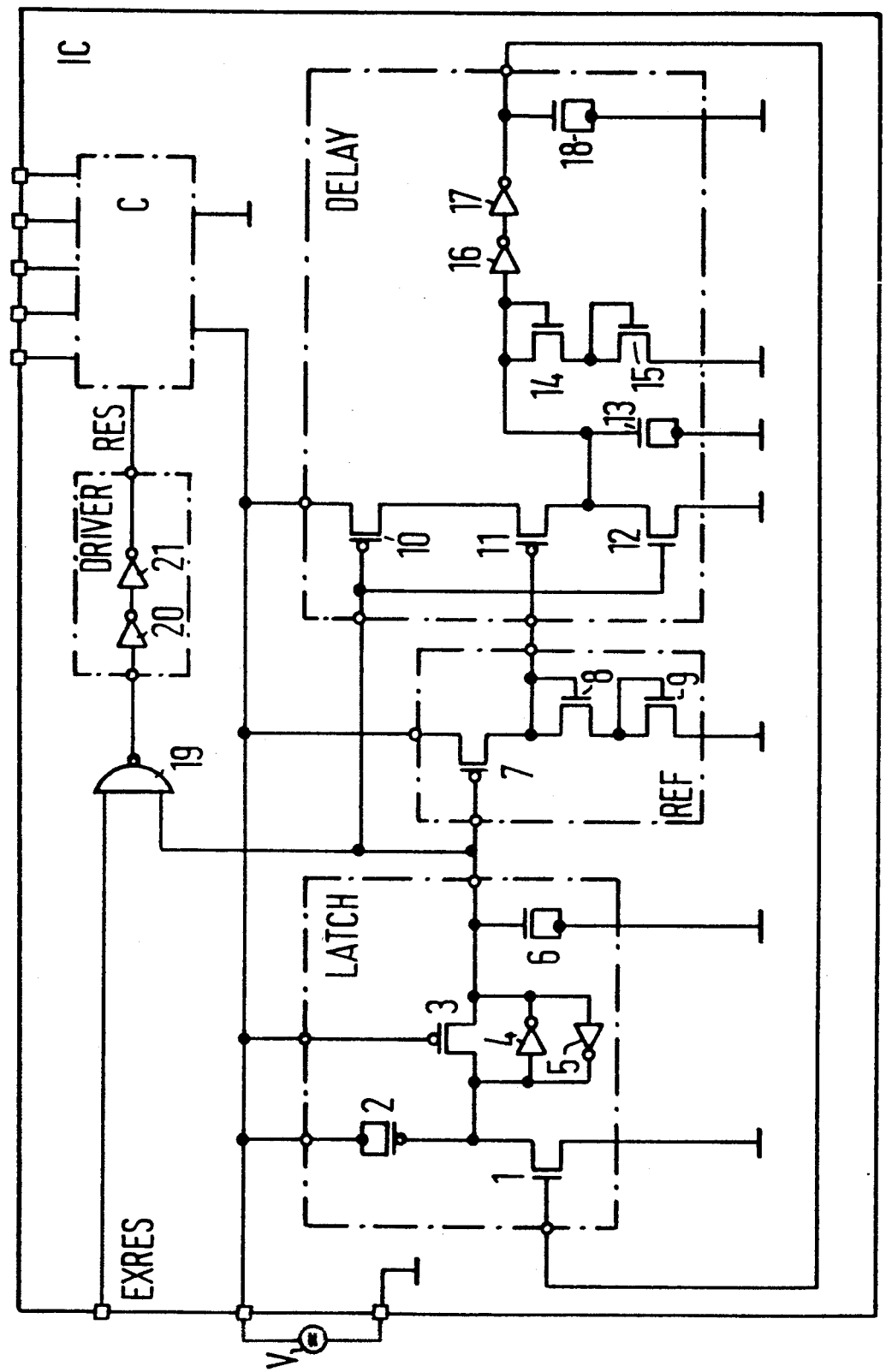

CIRCUIT CONFIGURATION FOR GENERATING A REST SIGNAL

The invention relates to a circuit configuration for generating a reset signal.

After an operating voltage is turned on, digitally integrated circuits are in an undefined state. Initializing of the integrated circuit is performed with a reset signal, which is typically generated by an external logic and supplied to the integrated circuit through an external reset input. The advantage of an external logic for generating the reset signal is that the external logic can be adapted most accurately to special features of the voltage supply, above all in terms of the course of the voltage rise at turn-on. However, a disadvantage is the circuit expenditure that is additionally necessary.

It is accordingly an object of the invention to provide a circuit configuration for generating a reset signal, which overcomes the hereinafore-mentioned disadvantages of the heretofore-known devices of this general type, which can be integrated with the applicable integrated circuit and which is maximally independent of the turn-on behavior of the supply voltage.

With the foregoing and other objects in view there is provided, in accordance with the invention, a circuit configuration for generating a reset signal, comprising a bistable switch element assuming a preferential state upon application of a supply voltage, the bistable switch element having an output carrying a reset signal in the preferential state and having an input, an on and off switchable reference voltage source having a control input connected to the output of the bistable switch element, the on and off switchable reference voltage source being switched on in the preferential state of the bistable switch element, and an on and off switchable delay line having a control terminal connected to the output of the bistable switch element, an output connected to the input of the bistable switch element, and a reference input connected to the on and off switchable reference voltage source for switching on the delay line in the preferential state of the bistable switch element, the bistable switch element being switched out of the preferential state with a time delay when the supply voltage exceeds a reference value specified by the on and off switchable reference voltage source.

In accordance with another feature of the invention, there is provided a supply voltage source for issuing the supply voltage, the supply voltage source having two poles, the bistable switch element having a first MOSFET of one conduction type having a source terminal connected to one of the poles of the supply voltage source, a gate terminal forming the input of the bistable switch element and a drain terminal; a first capacitor connected between the other of the poles of the supply voltage source and the drain terminal of the first MOSFET; two antiparallel-connected inverters; a second MOSFET of the other conduction type having a source-to-drain path connected parallel to the inverters and a gate terminal connected to the other pole of the supply voltage source, the inverters and the second MOSFET being connected between the output of the bistable switch element and the drain terminal of the first MOSFET; and a second capacitor connected between the output of the bistable switch element and the one pole of the supply voltage source.

In accordance with a further feature of the invention, the two inverters are dimensioned asymmetrically.

In accordance with an added feature of the invention, the reference voltage source being switchable on and off includes a third MOSFET of the other conduction type having a drain terminal connected to the other pole of the supply voltage source, a gate terminal forming the control input of the reference voltage source that can be turned on and off and a source terminal forming the output of the reference voltage source that can be turned on and off, and diodes connected in series between the source terminal of the third MOSFET and the one pole of the supply voltage source.

In accordance with an additional feature of the invention, the delay line being switchable on and off includes a fourth MOSFET of the other conduction type having a drain terminal connected to the other pole of the supply voltage source, a gate terminal forming the control terminal of the delay line being switchable on and off, and having a source terminal; a fifth MOSFET of the other conduction type having a drain terminal connected to the source terminal of the fourth MOSFET, a gate terminal forming the reference input of the delay line being switchable on and off, and having a source terminal; a sixth MOSFET of the one conduction type having a gate terminal connected to the gate terminal of the fourth MOSFET, a drain terminal connected to the source terminal of the fifth MOSFET and a source terminal connected to the one pole of the supply voltage source; a third capacitor connected parallel to the source-to-drain path of the sixth MOSFET; a discharge resistor connected parallel to the third capacitor; two series-connected inverters connected to the drain terminal of the sixth MOSFET and to the output of the delay line delay being switchable on and off; and a fourth capacitor connected between the output of the delay line delay being switchable on and off and the one pole of the supply voltage source.

In accordance with yet another feature of the invention, there is provided a logic gate having one input connected to the output of the bistable switch element, another input being acted upon by an external reset signal, and an output carrying the first-mentioned reset signal.

In accordance with yet a further feature of the invention, there is provided a driver stage through which the reset signal is carried.

In accordance with yet an added feature of the invention, the capacitors are MOSFETs having interconnected source and drain terminals.

In accordance with yet an additional feature of the invention, the diodes are MOSFETs having interconnected drain and gate terminals.

In accordance with a concomitant feature of the invention, there is provided a supply voltage source for issuing the supply voltage, the bistable switch element, the reference voltage source and the delay line being part of an integrated circuit, and the integrated circuit also including further circuit components being connected to the supply voltage source and being reset upon the appearance of the reset signal.

The advantages of the invention are that the circuit configuration according to the invention is easily integratable with various CMOS technologies; that with an active reset signal a low supply current flows, while with an inactive reset signal practically no supply current flows; that the rise of the supply voltage to its rated value can take place within a relatively long period of time; and that the circuit expenditure is low.

Other features which are considered as characteristic for the invention are set forth in the appended claims.

Although the invention is illustrated and described herein as embodied in a circuit configuration for generating a reset signal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

The drawing is a schematic and block circuit diagram of an exemplary embodiment of the invention.

Referring now to the single figure of the drawing in detail, there is seen a circuit configuration according to the invention for generating a reset signal RES, which includes at least one bistable switch element LATCH, a reference voltage source REF that can be turned on and off, and a delay line DELAY that can be turned on and off. The bistable switch element LATCH is constructed in such a way that it assumes a preferential state upon the application of a supply voltage from a supply voltage source V. One control input of the reference voltage source REF that can be turned on and off is connected to an output of the bistable switch element LATCH. In the preferential state of the bistable switch element LATCH, the reference voltage source REF is turned on, whereas otherwise, it is off. Connected to an output of the reference voltage source REF is a reference input of the delay line DELAY, the reference input of which is coupled to the output of the bistable switch element LATCH, and the output of which is coupled to one input of the bistable switch element LATCH.

Also connected to the output of the bistable switch element LATCH is one input of a NAND gate 19, having another input which is acted upon by an external reset signal EXRES. A driver stage DRIVER is connected to the output of the NAND gate 19. An output of the driver stage DRIVER carries the reset signal RES, which is applied to further circuit components C that are not described in further detail herein. These further circuit components C, like the reference voltage source REF and the delay line DELAY, are connected to the supply voltage source V. The entire configuration, including the further circuit components C, is a component of an integrated circuit IC. Besides terminals for supplying the external reset signal EXRES and for the supply voltage source V, other terminals that are connected to the further circuit components C are also provided, but they are not provided with reference numerals.

According to a further feature of the invention, in the present exemplary embodiment the bistable switch element LATCH includes a first n-channel MOS field effect transistor 1, having a source terminal which is connected to one pole of the supply voltage source V and a gate terminal which forms the input of the bistable switch element LATCH, a first capacitor 2 connected between the other pole of the supply voltage source V and the drain terminal of the first MOSFET 1, two antiparallel connected inverters 4 and 5, and a second MOSFET 3 of the p-channel type. The second MOSFET 3 has a gate terminal connected to the other pole of the supply voltage source V and a source-to-drain path which is connected between the output of the bistable switch element LATCH and the drain terminal of the first MOSFET 1 and is also connected parallel to the inverters 4 and 5. The bistable switch element LATCH also has a second capacitor 6, which is connected between the output of the bistable switch element LATCH and the one pole of the supply voltage source V. The two capacitors 2 and 6 are each constructed as MOSFETs, having source and drain terminals connected to one another. A p-channel MOSFET is used for the first capacitor 2 and an n-channel MOSFET is used for the second capacitor 6. The two inverters 4 and 5 form a storage element, which is brought to a preferential state upon run-up of the supply voltage, by means of an asymmetrical dimensioning of the two inverters 4 and 5 and by means of the capacitors 2 and 6. In the exemplary embodiment shown, the preferential state is defined by a logical zero at the input and output of the bistable switch element LATCH. In this state, the reset signal RES is active. By triggering the MOSFET 1 with a logical 1, the bistable switch element LATCH is flipped to its complementary state, corresponding to a logical 1 at the output and to an inactive reset signal RES. If the voltage at the supply voltage source V of the integrated circuit IC is switched off, voltages remain stored in the capacitors 2 and 6. In order to prevent them from impeding initializing of the bistable switch element LATCH upon the next run-up of the supply voltage, they are short-circuited through the MOS transistor 3 if the supply voltage is lacking.

According to a further feature of the invention, in the exemplary embodiment shown, the reference voltage source REF that can be turned on and off includes a third p-channel MOSFET 7, having a drain terminal which is connected to the other pole of the supply voltage source V, a gate terminal which forms the control input and a source terminal which forms the output of the reference voltage source REF that can be turned on and off. The reference voltage source REF also has diodes 8 and 9 connected in series between the source terminal of the MOSFET 7 and the one pole of the supply voltage source V. The diodes 8 and 9 are formed by MOSFETs, in which the drain terminals and gate terminals are connected to one another. These two MOSFETs are connected as so-called transistor diodes, and in this type of circuitry they have a characteristic curve similar to that of conventional diodes. Upon a rise of the supply voltage from zero to the rated value, the voltage at the output of the reference voltage source REF that can be turned on and off initially increases to the same extent as the supply voltage, because the two diodes 8 and 9 block in this phase. However, as soon as the gate-to-source voltage of the MOSFETs forming the two diodes 8 and 9 exceed their cutoff voltage, the diodes begin to be conducting. As a result, the voltage at the output of the reference voltage source REF that can be turned on and off is limited to a value of approximately twice the cutoff voltage.

According to a further feature of the invention, the delay line DELAY that can be turned on and off includes fourth a p-channel MOSFET 10 having a drain terminal which is connected to the other pole of the supply voltage source V and a gate terminal which forms the control terminal of the delay line DELAY that can be turned on and off. The delay line DELAY also includes a fifth p-channel MOSFET 11 having a drain terminal which is connected to the source terminal of the MOSFET 10 and a gate terminal which forms the reference input. A sixth n-channel MOSFET 12 which is also provided, has a gate terminal that is connected to the gate terminal of the MOSFET 10, a drain terminal that is connected to the source terminal of the MOSFET 11, and a source terminal that is connected to the one pole of the supply voltage source V. If the delay line DELAY is considered alone, then the MOSFETs 10, 11 and 12 can be considered first, second and third MOSFETs. Finally, the delay line DELAY that can be switched on and off has a capacitor 13, which is connected parallel to the source-to-drain path of the MOSFET 12, two series-connected resistors 14 and 15 connected parallel to the capacitor 13, two series-connected further inverters 16 and 17, which are connected on one hand to the drain terminal of the MOSFET 12 and on the other hand to the output of the delay line DELAY that can be switched on and off, and a capacitor 18 which is connected between the output of the delay line that can be turned on and off and the one pole of the supply voltage source V. After the supply voltage source V is turned on, the capacitor 13 is charged to the rated value, once the two MOSFETs 10 and 11 are conducting, or in other words when the voltages at the output of the bistable switch element LATCH and of the reference voltage source REF that can be turned on and off exceed the cutoff voltage of the applicable MOSFET 10 or 11. As soon as the voltage at the capacitor 13 exceeds the switch threshold of the inverter 16, the two inverters 16 and 17 become conducting and charge the capacitor 18. This makes the signal at the input of the bistable switch element LATCH equal to a logical 1. The bistable switch element LATCH thus flips from its preferential direction, and the reset signal RES becomes inactive. In order to prevent any voltages that could impede a regeneration of a reset signal from being stored in the capacitors 13 and 18, they are discharged completely, or virtually completely, by means of the MOSFET 12 or the inverter 17 if the reset signal RES is inactive. In the event of a very slow rise of the supply voltage, into a range on the order of seconds, the capacitor 13 is charged by leakage currents of the MOSFETs 7 and 8. This can cause a signal change at the input of the bistable switch element LATCH to occur too early. The two MOSFETs that are connected as the resistors 14 and 15 prevent this, by forming a discharge resistor for the capacitor 13. In principle, the MOSFETs of the two resistors 14 and 15 are connected like diodes, for instance like the diodes 8 and 9, but they have a long channel length and a small channel width and therefore act only as resistors. The gate terminal of the MOSFET 11 is connected to the output of the reference voltage source REF that can be switched on and off. Once the supply voltage rises past twice the cutoff voltage of the two diodes 8 and 9, the gate-to-source voltage of the MOSFET 10 finally becomes greater than its cutoff voltage, and it begins to conduct, as a result of which the delay line is activated. Without taking any substrate control factor into account, the reset signal RES remains active at least until such time as the supply voltage has exceeded a value that is approximately equal to twice the cutoff voltage of the diodes 8 and 9, plus the cutoff voltage of the MOSFET 10. Finally, the signal present at the output of the bistable switch element LATCH is linked to the external reset signal EXRES through the NAND gate 19, as a result of which resetting of the other circuit components C is possible even after the turn-on of the supply voltage source V. The reset signal RES is carried through the driver stage DRIVER, which includes two series-connected inverters 20 and 21. Thus, first decoupling of the output of the bistable switch element LATCH or of the NAND gate 19 from the other circuit components C, and second a higher fan-out, are attained.

I claim:

1. A circuit configuration for generating a reset signal, comprising:

a bistable switch element assuming a preferential state upon application of a supply voltage, said bistable switch element having an output carrying a reset signal in the preferential state and having an input.

an on and off switchable reference voltage source having a control input connected to the output of said bistable switch element, said on and off switchable reference voltage source being switched on in the preferential state of said bistable switch element, an on and off switchable delay line having a control terminal connected to the output of said bistable switch element, an output connected to the input of said bistable switch element, and a reference input connected to said on and off switchable reference voltage source for switching on said delay line in the preferential state of said bistable switch element, said bistable switch element being switched out of the preferential state with a time delay when the supply voltage exceeds a reference value specified by said on and off switchable reference voltage source, and including a supply voltage source for issuing the supply voltage, said supply voltage source having two poles, said bistable switch element having a first MOSFET of one conduction type having a source terminal connected to one of the poles of said supply voltage source, a gate terminal forming the input of said bistable switch element and a drain terminal; a first capacitor connected between the other of the poles of said supply voltage source and the drain terminal of said first MOSFET; two antiparallel-connected inverters; a second MOSFET of the other conduction type having a source-to-drain path connected parallel to said inverters and a gate terminal connected to the other pole of said supply voltage source, said inverters and said second MOSFET being connected between the output of said bistable switch element and the drain terminal of said first MOSFET; and a second capacitor connected between the output of said bistable switch element and the one pole of said supply voltage source.

2. The circuit configuration according to claim 1, wherein said bistable switch element, said reference voltage source and said delay line are part of an integrated circuit, and said integrated circuit also including further circuit components being connected to said supply voltage source and being reset upon the appearance of the reset signal.

3. The circuit configuration according to claim 1, wherein said two inverters are dimensioned asymmetrically.

4. The circuit configuration according to claim 1, wherein said two poles of said supply voltage source are first and second poles, said on and off switchable reference voltage source including a MOSFET having a drain terminal connected to the second pole of the supply voltage source, a gate terminal forming the control input of said reference voltage source that can be turned on and off and a source terminal forming the output of said reference voltage source that can be turned on and off, and diodes connected in series between the source terminal of said MOSFET and the first pole of said supply voltage source.

5. The circuit configuration according to claim 1, wherein said on and off switchable reference voltage source includes a third MOSFET of the other conduction type having a drain terminal connected to the other pole of the supply voltage source, a gate terminal forming the control input of said reference voltage source that can be turned on and off and a source terminal forming the output of said reference voltage source that can be turned on and off, and diodes connected in series between the source terminal of said third MOSFET and the one pole of said supply voltage source.

6. The circuit configuration according to claim 5, wherein said on and off switchable delay line includes a fourth MOSFET of the other conduction type having a drain terminal connected to the other pole of said supply voltage source, a gate terminal forming the control terminal of said on and off switchable delay line, and having a source terminal; a fifth MOSFET of the other conduction type having a drain terminal connected to the source terminal of said fourth MOSFET, a gate terminal forming the reference input of said on and off switchable delay line, and having a source terminal; a sixth MOSFET of the one conduction type having a gate terminal connected to the gate terminal of said fourth MOSFET, a drain terminal connected to the source terminal of said fifth MOSFET and a source terminal connected to the one pole of said supply voltage source; a third capacitor connected parallel to the source-to-drain path of said sixth MOSFET; a discharge resistor connected parallel to said third capacitor; two series-connected inverters connected to the drain terminal of said sixth MOSFET and to the output of said on and off switchable delay line; and a fourth capacitor connected between the output of said on and off switchable delay line and the one pole of said supply voltage source.

7. A circuit configuration for generating a reset signal, comprising:
a bistable switch element assuming a preferential state upon application of a supply voltage, said bistable switch element having an output carrying a reset signal in the preferential state and having an input,
an on and off switchable reference voltage source having a control input connected to the output of said bistable switch element, said on and off switchable reference voltage source being switched on in the preferential state of said bistable switch element.
an on and off switchable delay line having a control terminal connected to the output of said bistable switch element, an output connected to the input of said bistable switch element, and a reference input connected to said on and off switchable reference voltage source for switching on said delay line in the preferential state of said bistable switch element,
said bistable switch element being switched out of the preferential state with a time delay when the supply voltage exceeds a reference value specified by said on and off switchable reference voltage source, and
including a supply voltage source for issuing the supply voltage, said supply voltage source having first and second poles, said on and off switchable delay line including a first MOSFET of a given conduction type having a drain terminal connected to the second pole of said supply voltage source, a gate terminal forming the control terminal of said on and off switchable delay line, and having a source terminal; a second MOSFET of the given conduction type having a drain terminal connected to the source terminal of said first MOSFET, a gate terminal forming the reference input of said on and off switchable delay line, and having a source terminal; a third MOSFET of a conduction type opposite the given type having a gate terminal connected to the gate terminal of said first MOSFET, a drain terminal connected to the source terminal of said second MOSFET and a source terminal connected to the first pole of said supply voltage source; a capacitor connected parallel to the source-to-drain path of said third MOSFET; a discharge resistor connected parallel to said capacitor; two series-connected inverters connected to the drain terminal of said third MOSFET and to the output of said on and off switchable delay line; and another capacitor connected between the output of said on and off switchable delay line and the first pole of said supply voltage source.

8. A circuit configuration for generating a reset signal, comprising:
a bistable switch element assuming a preferential state upon application of a supply voltage, said bistable switch element having an output carrying a reset signal in the preferential state and having an input,
an on and off switchable reference voltage source having a control input connected to the output of said bistable switch element, said on and off switchable reference voltage source being switched on in the preferential state of said bistable switch element,
an on and off switchable delay line having a control terminal connected to the output of said bistable switch element, an output connected to the input of said bistable switch element, and a reference input connected to said on and off switchable reference voltage source for switching on said delay line in the preferential state of said bistable switch element,
said bistable switch element being switched out of the preferential state with a time delay when the supply voltage exceeds a reference value specified by said on and off switchable reference voltage source, and
including a logic gate having one input connected to the output of said bistable switch element, another input being acted upon by an external reset signal, and an output carrying the first-mentioned reset signal.

9. The circuit configuration according to claim 1, including a driver stage through which the reset signal is carried.

10. The circuit configuration according to claim 1, wherein said capacitors are MOSFETs having interconnected source and drain terminals.

11. The circuit configuration according to claim 6, wherein said capacitors are MOSFETs having interconnected source and drain terminals.

12. The circuit configuration according to claim 7, wherein said capacitors are MOSFETs having interconnected source and drain terminals.

13. The circuit configuration according to claim 4, wherein said diodes are MOSFETs having interconnected drain and gate terminals.

14. The circuit configuration according to claim 5, wherein said diodes are MOSFETs having interconnected drain and gate terminals.

* * * * *